United States Patent [19]

Manabe

[11] Patent Number: 4,882,616
[45] Date of Patent: Nov. 21, 1989

[54] COLOR FILTER FOR A SOLID STATE IMAGING DEVICE

[75] Inventor: Daisuke Manabe, Tokyo, Japan

[73] Assignee: Nippon Electric Co., Ltd., Tokyo, Japan

[21] Appl. No.: 205,591

[22] Filed: Jun. 8, 1988

Related U.S. Application Data

[63] Continuation of Ser. No. 48,493, Apr. 24, 1987, abandoned, which is a continuation of Ser. No. 886,950, Jul. 23, 1986, which is a continuation of Ser. No. 796,689, Nov. 12, 1985, which is a continuation of Ser. No. 709,839, Mar. 8, 1985, which is a continuation of Ser. No. 393,252, Jun. 29, 1985, abandoned.

[30] Foreign Application Priority Data

Jun. 29, 1981 [JP] Japan ................................. 56-100808
Jun. 29, 1981 [JP] Japan ................................. 56-100810

[51] Int. Cl.$^4$ .......................... H04N 9/07; G03C 5/00
[52] U.S. Cl. ......................................... 358/44; 358/41; 430/235; 430/396; 430/941
[58] Field of Search .................. 358/41, 43, 44, 45, 358/46; 313/371, 374; 350/317; 430/4, 67, 235, 396, 941

[56] References Cited

U.S. PATENT DOCUMENTS

| | | | |
|---|---|---|---|
| 4,200,892 | 4/1980 | Weimer | 358/44 |
| 4,204,866 | 5/1980 | Horak | 358/44 |
| 4,214,264 | 7/1980 | Hayward | 358/44 |
| 4,285,007 | 8/1981 | Nakano | 358/44 |
| 4,348,690 | 9/1982 | Jastrzebski | 358/44 |
| 4,395,629 | 7/1983 | Sasano | 358/44 |

Primary Examiner—Tommy P. Chin
Attorney, Agent, or Firm—Sughrue, Mion, Zinn, Macpeak & Seas

[57] ABSTRACT

A color filter, particularly a color filter for a solid state imaging device, comprising a dyeable resin layer, a plurality of variously colored dyed-areas formed in the dyeable resin layer, a plurality of non-dyed areas separating the dyed area from each other in the dyeable resin layer, and a plurality of photo-interception areas formed on the non-dyed areas is disclosed. The dyed areas are generally separated from each other by a distance greater than the diffusion length generated during dyeing or heat treatment. The dyed areas can also be spread under the photo-interception areas by a distance substantially equal to the diffusion length generated during dyeing or heat treatment.

7 Claims, 1 Drawing Sheet

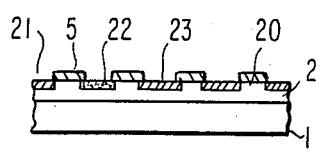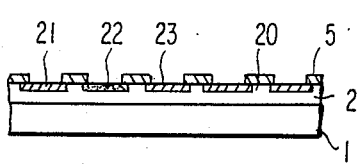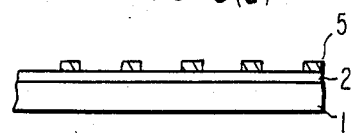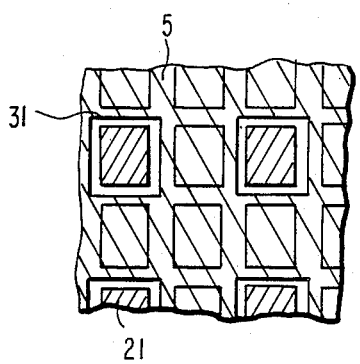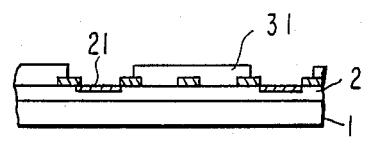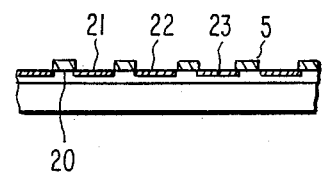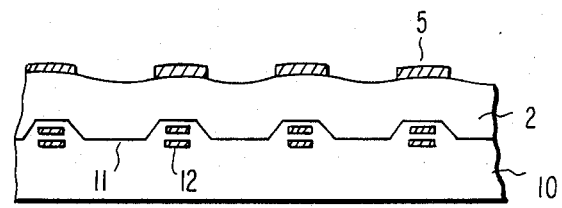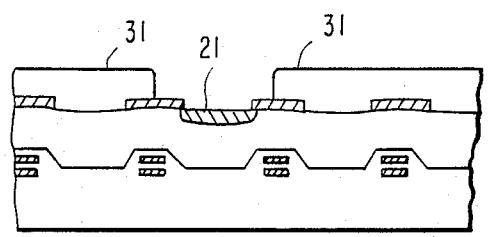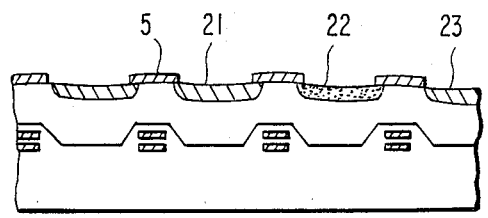

COLOR FILTER FOR A SOLID STATE IMAGING DEVICE

This is a continuation of application Ser. No. 048,493 filed Apr. 24, 1987, now abandoned, which is a continuation of application Ser. No. 886,950, filed 7/23/86, which is a continuation of Ser. No. 796,689, filed 11/12/85, which is a continuation of Ser. No. 709,839 filed 3/8/85, which is a continuation of Ser. No. 393,252, filed 6/29/82, now abandoned.

BACKGROUND OF THE INVENTION

1. Field of the Invention

This invention relates to a color filter for color separation purposes and more particularly to a color filter suitable for a solid state color imaging device.

2. Description of the Prior Art

In a color television camera utilizing one or two solid state imaging devices such as CCD's, BBD's and MOS devices, a mosaic or stripe color filter is employed for color separation purposes. The color filter is either formed on a transparent substrate such as glass and affixed to the picture elements of the imaging device is directly formed on the imaging device.

Heretofore, color filters have been well known in which proteinic resins such as gelatin, casein and glue, or dyeable resins such as polyvinyl alcohol, acrylic, polycarbonate, polyamide, and polyester are dyed. In a conventional color filter, uniform dyeing layers on the transparent substrate or on the imaging devices are dyed in red, green, and blue, or separated dyeing areas are accumulated through intermediate layers of dyeing resistant.

In a color filter for a high resolution imaging device, the dyed color areas are small, and consequently, high dimensional accuracy is required. Generally, through the use of prior art techniques, either a gap results in the boundary area between the respective dyed color areas or else the color areas intermix with each other thus causing blurring. A deterioration in resolution results either way.

To avoid the gap in the boundary area between the color areas, the color areas can be overlapped by a predetermined width. Such an overlapping causes blurring. Another possible solution involves forming light-interception layers on the supporting member so that the boundaries can be positioned thereon. In the case where the dyed color areas are directly formed on an imaging device having an uneven surface, it is difficult to form fine photo-interception areas or mosaic or stripe dyeing areas.

It is an object of this invention, therefore to provide a color filter suitable for a solid state imaging device in which blurring is not generated.

SUMMARY OF THE INVENTION

According to this invention, there is provided a color filter comprising a plurality of dyed color areas formed in a dyeable resin layer. The dyed areas are separated from each other by a plurality of non-dyed areas in the dyeable resin layer. A plurality of photo-interception layers are formed on the non-dyed areas.

DESCRIPTION OF THE DRAWINGS

The features and advantages of this invention will be apparent from the following description of preferred embodiments of this invention taken in conjunction with the accompanying drawings, wherein:

FIGS. 1 and 2 are side views of color filters according to this invention;

FIGS. 3(a) to 3(d) show steps in the method for making the color filter according to this invention; and FIGS. 4(a) to 4(c) show steps in the method for making the color filter on an imaging device according to this invention.

GENERAL DESCRIPTION OF THE INVENTION

In a color filter in which a dyeable resin layer is dyed in various colors by use of a dyeing mask, a heat resistant resin can be used as the dyeing resin. In this case, however, when dyed areas are overlapped at a boundary or are in contact with each other, blurring due to the diffusion of dye is generated at the boundaries of the dyed area during dyeing or during heat treatment thereafter. An experiment shows that the diffusion length, when the dyed areas are overlapped or are in contact to each other, is greater than the diffusion length when the dyed areas are separated from each other.

Therefore, it is possible to prevent blurring by separating the dyed areas 21~23 from each other through the use of non-dyed area 20 which has a width greater than the diffusion length of the dye during dyeing or heat treatment, as shown in FIG. 1.

The width necessary for the non-dyed area is less than several microns. For example, in the case where polyester sulphone resin (PES resin-marketed by Sumitomo Chemical Co., Ltd.) is dyed through the use of a disperse dye, the diffusion length generated during heat treatment at 180° C. for 10 hours is about 0.5 $\mu$m. In this case, the blurring is eliminated by separating the dyed areas from each other through the use of a non-dyed area having a width larger than 1.5 $\mu$m.

On the other hand, solid state imaging devices have a photosensitive portion for photo-electric converting and a non-photosensitive portion, including charge-coupled areas and channel stoppers. The width of the non-photosensitive portion is greater than several microns. This means that it is possible to position the non-dyed area having a width of several microns on the non-photosensitive portion of the solid state imaging device.

When light is impinged on the non-photosensitive portion, e.g., on the channel stoppers, photo carriers are produced beneath the channel stoppers and are diffused to the photosensitive portion resulting in blurring. Therefore, the non-photosensitive portions are covered by photo-interception layers 5 formed on the non-dyed areas 20 to intercept light to the non-dyed areas, as shown in FIG. 1.

It is also possible, as shown in FIG. 2, to allow the width of the photo-interception layers 5 to be greater than that of the non-dyed areas 20.

For the photo-interception layers, all materials that can possibly be patterned in etching or lift off can be employed. For example, the following can be employed: metals such as aluminium, chrome and zinc, resins dyed in black, and metal oxides, nitrides or sulfides.

In the case where the reflectivity of the material constituting the photo-interception layer is great, a flare is generated due to the light reflected by the photo-interception layer, thus causing a deterioration in color reproduction. Therefore, it is desirable that the reflectivity be less than 30%, and preferably less than 10%. Further, it is possible to form the photo-interception area by using two or more layers, with the reflectivity of the material at the input-side being lower.

The following compound can be employed as materials having a low-reflectivity: metal oxides such as CrO, $V_2O_3$, NbO, $Ag_2O$, CuO, NiO, $WO_2$, $MoO_2$ and FeO, metal nitride such as GaN, CrN, NbN and TaN, and metal sulfide such as $Ag_2S$, $Cr_2S_3$, CoS, CuS and PbS.

The material of low reflectivity is, for example, vacuum-evaporated and then patterned by means of etching or lift-off to form the photo-interception layer 5.

An anode oxide film of aluminum dyed in black, black chrome gilt, or blacked copper, zinc, nickel, or iron may be employed as the photo-interception layer 5 of low reflectivity.

In the case where a single dyed area is formed in correspondence with a plurality of picture elements of the solid state imaging device, the photo-interception layers may be formed not only on the non-dyed areas but also on the non-photosensitive portions of all the picture elements. In this manner, it is possible to reduce the imbalance in sensitivities of the picture elements due to the influence of the channel stoppers.

DESCRIPTION OF THE PREFERRED EMBODIMENTS

First Embodiment

The dyeing resin layer 2 having a thickness of 3 μm is formed on the glass substrate 1 by spin-coating a solution in which the polyester sulphone resin (PES resin) is dissolved into N-methyl.2 pyrrolidone (NMP) with a density of 0.25 g/cc. Aluminum is then vacuum-evaporated with a thickness of 0.2 μm on the dyeing resin layer 2. An etching mask is formed by use of a photo resist AZ1350 (marketed by Shipray Corporation). After the aluminum has been etched by use of phosphoric acid, the photo resist AZ1350 is removed. The photo-interception areas 5 each have X-direction width of 8 μm, X-direction pitch of 33 μm, Y-direction width of 4 μm and Y-direction pitch of 40 μm, as shown in FIG. 3(a).

Then, as shown in FIG. 3(b), a first dyeing mask 31 is formed by use of a casein photo resist G-90S (marketed by Tokyo Ohka Company). The dyeing resin is dyed in blue by the dye transfer method at 210° C. by use of a disperse dye Sumikaron Blue E-FBL (marketed by Sumitomo Chemical Co., Ltd.) to form a first dyed (blue) area 21. FIG. 3(d) shows a planar view of the filter shown in FIG. 3(b).

Then, second (green) and third (red) dyed areas 22 and 23 are formed in a similar manner to obtain the color filter, as shown in FIG. 3(c).

Experimental results show that the dyed areas 21, 22 and 23 are spread under the photo-interception areas 5 by 0.2~1 μm. The non-dyed areas 20 are formed under the photointerception areas 5, whereby the dyed areas are separated from each other to prevent the blurring.

Second Embodiment

The dyeing resin layer 2 is formed through the use of PES resin, in the same manner as in the first embodiment, on the inter-line type CCD imaging device 10 in which the picture elements have X-direction pitch of 33 μm and Y-direction pitch of 20 μm, whereby the evenness of about 2 μm between the photosensitive portions 11 and the charge coupled portions 12 becomes about 0.5 μm on the surface of the dyeing resin layer 2, as shown in FIG. 4(a).

Then, as shown in FIG. 4(b), the photointerception areas 5 of low reflectivity are formed by use of NbO, in the same manner as in the first embodiment, on the dyeing resin layer 2 with a width of 8 μm on the charge coupled portions 12, and a width of 4 μm on the channel stoppers (not shown).

The dyeings in blue, green and red are achieved as in the first embodiment to provide the dyed areas 21, 22 and 23, whereby the color imaging device on which the color filter is provided can be obtained, as shown in FIG. 4(c).

The colors in the color filter may be selected as a color combination of two or more colors, for example, three primary colors of red-green-blue, and complementary colors of yellow, cyan, magenta or white (colorless in the filter).

In the above embodiments, the dyed areas are positioned in mosaic. It is possible to position the dyed areas in stripe.

What is claimed is:

1. A color imaging device comprising:
    a solid state imaging device comprising a plurality of photosensitive portions and a plurality of non-photosensitive portions, surfaces of said photosensitive portions positioned lower than said non-photosensitive portions;
    a dyeable resin layer formed on said solid state imaging device to form a flat surface, said dyeable resin layer being in contact with both of said photosensitive portions and said non-photosensitive portions;
    a plurality of dyed areas formed in said dyeable resin layer positioned on said photosensitive portions, said dyed areas being dyed in a plurality of colors;
    a plurality of non-dyed areas in said dyeable resin layer positioned on said non-photosensitive portions, said dyed areas being separated from each other by said non-dyed areas; and
    a plurality of photo-interception areas on said non-dyed areas to define said dyed and said non-dyed areas.

2. The color imaging device according to claim 1, wherein said photo-interception areas have a reflectivity of less than 30%.

3. The color imaging device according to claim 1, wherein said photo-interception areas have a reflectivity of less than 10%.

4. The color imaging device according to claim 1, wherein said dyed areas are formed in a mosaic pattern.

5. The color imaging device according to claim 1, wherein said dyed areas are formed in a stripe pattern.

6. The color imaging device according to claim 1, wherein said photo-interception areas are wider than said non-dyed areas.

7. A method of manufacturing a color imaging device, said method comprising the steps of:
    forming a solid state imaging device having a plurality of photosensitive portions and a plurality of non-photosensitive portions, surfaces of said photosensitive portions positioned lower than said non-photosensitive portions;
    depositing a dyeable resin layer on said photosensitive and said non-photosensitive portions to form a flat surface, said dyeable resin layer being in contact with both of said photosensitive and non-photosensitive portions;
    forming a plurality of photo-interception areas which are in substantial registration with said non-photosensitive portions; and
    dyeing said dyeable resin layer with said photo-interception areas partially used as a mask to define, in said dyeable resin layer, a plurality of dyed areas and a plurality of non-dyed areas which are positioned on said photosensitive portions and said non-photosensitive portions, respectively.

* * * * *